(12) United States Patent
Jing et al.

(10) Patent No.: US 6,178,188 B1
(45) Date of Patent: Jan. 23, 2001

(54) LASER ASSEMBLY PLATFORM WITH SILICON BASE

(75) Inventors: Xingliang Jing, Fremont; Pedram A. Leilabady, San Diego, both of CA (US)

(73) Assignee: Photera Technologies, Inc, San Diego, CA (US)

( * ) Notice: Under 35 U.S.C. 154(b), the term of this patent shall be extended for 0 days.

(21) Appl. No.: 08/988,947

(22) Filed: Dec. 11, 1997

(51) Int. Cl.[7] .............................. H01S 5/024; H01S 5/022
(52) U.S. Cl. ................................ 372/36; 372/34; 372/75
(58) Field of Search .............................. 372/75, 36, 34, 372/109; 385/88, 93

(56) References Cited

U.S. PATENT DOCUMENTS

| | | | |
|---|---|---|---|
| 5,181,214 | 1/1993 | Berger et al. | 372/34 |
| 5,265,115 | 11/1993 | Amano | 372/75 |
| 5,267,252 | 11/1993 | Amano | 372/34 |
| 5,329,539 | 7/1994 | Pearson et al. | 372/36 |
| 5,446,750 | 8/1995 | Ohtsuka et al. | 372/34 |
| 5,561,684 | 10/1996 | Martin | 372/107 |
| 5,566,264 | * 10/1996 | Kuke et al. | 372/108 |
| 5,694,048 | * 12/1997 | Boudreau et al. | 372/36 |
| 5,832,015 | * 11/1998 | Goto et al. | 372/36 |
| 5,854,867 | * 12/1998 | Lee et al. | 385/93 |
| 5,905,831 | * 5/1999 | Boudreau et al. | 385/88 |

* cited by examiner

Primary Examiner—James W. Davie
(74) Attorney, Agent, or Firm—Law Offices of James D. McFarland

(57) ABSTRACT

A laser assembly including a silicon base and method are provided for assembling lasers on a platform in a reliable, low cost process that is suitable for high volume production. The platform can be a monolithic silicon base which has high thermal conductivity, a low coefficient of thermal expansion, and whose features can be formed with close tolerances in a low cost, reliable manner. Materials with similar coefficients of thermal expansion are used in order to maintain alignment during unexpected heating and cooling. Furthermore, a method is described that substantially eliminates the need for adhesives to bond laser components to a platform. The resultant laser can be very robust, stable, and can provide reliable operation over extended time periods.

22 Claims, 5 Drawing Sheets

LASER ASSEMBLY PLATFORM WITH SILICON BASE

BACKGROUND OF THE INVENTION

1. Field of the Invention

The present invention relates to lasers, and particularly to manufacturing lasers using a monolithic platform that has a silicon base.

2. Description of Related Art

One important type of laser is a diode-pumped solid-state laser ("DPSSL"), which includes a solid-state gain medium pumped by optical radiation from a laser diode. Diode-pumped solid-state lasers can be useful in a wide variety of applications including laser display systems, optical data storage systems, medical instrumentation, and telecommunications. For small to moderate levels of optical power, one particularly useful diode-pumped solid-state laser is a microlaser, which comprises a short element (i.e. less than about five mm) of solid-state gain medium positioned in a resonant cavity. The pump beam is supplied by a semiconductor diode laser, which pumps the solid-state gain medium to provide energy to support laser operation within the resonant cavity. Two opposing reflective surfaces define the resonant cavity within which the gain medium is disposed. The opposing reflective surfaces may be formed directly on opposing ends of the solid-state gain medium, and the resulting structure is compact and reliable.

Optically-pumped solid-state lasers have many advantages relative to other lasers, including high efficiency, small size, and low cost when compared with other lasers. However, manufacturing difficulties have prevented high volume production and accordingly have prevented the cost reductions necessary to open up new markets and uses, as well as to make current uses more attractive from a price standpoint. If manufacturing processes could be improved to provide high volume and low cost, lasers could be utilized in numerous additional products and applications.

Lasers, including DPSSL's, have been assembled on optical benches to form laser assemblies. The optical benches or bases are the platform to which the components of the laser are attached. These bases have been formed by hand machining metals such as aluminum or copper. Such metals provide excellent heat dissipation characteristics, which are important for high power (e.g. greater than 100 milliwatt) operation. For example, copper has a thermal conductivity of about 300 W/m-° C. The benches are typically coupled to thermoelectric ("TE") coolers which provide temperature control. However, the large coefficient of thermal expansion for these metals renders them unsuitable for precision placement of optical components thereon, because even a small relative movement between optical components can drastically degrade performance of the laser and optical processing functions. Alternative materials such as the alloy invar have been used which alleviate thermal expansion problems. However, these materials are generally poor thermal conductors, which lead to heat dissipation problems that can be expensive or impossible to overcome. Invar, for example, has a thermal expansion coefficient of about $1.5 \times 10^{-6}$ m/° C., and a thermal conductivity of about 16 W/m/° C. It would be useful if an optical bench could be manufactured with a material that has a high thermal conductivity and a low coefficient of thermal expansion, and whose features can be formed with close tolerances in a low cost, reliable manner.

When metals such as copper and alloys such as invar are used as optical benches, each optical bench is machined individually, leading to inconsistencies between parts as well as adding significant cost. Furthermore, the inability of machining processes to achieve close tolerances requires substantial additional work (i.e. additional cost) to assemble a complete laser assembly. Invar particularly is very difficult to machine. It would be useful if batch processing methods such as precision etching of single-crystal silicon could be used to form bases identically and in large batches at low cost. However, three dimensional features in metals cannot be etched with sufficient precision, leaving machining as the only practical alternative for forming an optical bench of metals and alloys.

Lasers assemblies have been manufactured by hand by gluing free-standing optical components on optical benches in an exacting and laborious process For example, a skilled technician mounts each individual component on the optical benches, aligns each as it is glued into place, and then holds it in place for the length of time necessary to obtain a bond. Proper alignment of each component to within very narrow tolerances (e.g. five to ten microns) is critical because, without proper alignment, the laser will not operate. Due to the extremely narrow tolerances of optical systems, it can be difficult and time-consuming to achieve such tolerances with free-standing optical components. This can lead to excessive assembly time and reduced manufacturing yields, which translate directly to increased production costs.

Typically the laser diode is mounted on a first optical bench and the resonant cavity including the solid state gain medium is mounted on a separate second optical bench. Typically each of optical benches is provided with a separate TE cooler. One reason for the separate bases and TE coolers of conventional designs is to allow for thermal differences between the laser diode and the solid state gain medium or laser element (e.g. the diode and the laser element may require different operating temperatures for optimum performance). Of course this approach introduces additional difficulties in creating and maintaining proper alignment Even if the laser is aligned adequately during such conventional production, the glue drying process may introduce a small but significant optical misalignment during the glue drying time. Furthermore, subsequent use and heating during operation may cause slight misalignments, which can substantially degrade laser performance, or even halt it altogether.

Although such a hand assembly process of free-standing optical components may be suitable for low volume, high cost production, it is inappropriate for medium to large scale production. Furthermore, the nature of the hand assembly of free-standing optical components makes it difficult to achieve the economies of scale that will be necessary to reduce the cost per unit of the lasers.

Another problem with such an assembly process is caused by the adhesives used to glue the laser components to the platform. Adhesives within a laser can "outgas" certain airborne contaminants. In a hermetically-sealed laser, these outgassed contaminants become deposited upon the laser components, leading to significant contamination of critical surfaces such as the laser crystal face. Such a buildup can be avoided by eliminating the hermetically sealed enclosure and providing a constant flow of air; however, the air flow increases the likelihood of particulate contamination of the optical surfaces. It would be useful to provide an assembly method that reduces or eliminates adhesives so that a hermetically sealed enclosure can be used to provide a reliable defense against particulate contamination.

SUMMARY OF THE INVENTION

An apparatus and method are provided for assembling lasers on a platform in a reliable, low cost process that is suitable for high volume production. The platform can be a monolithic silicon base which has high thermal conductivity, a low coefficient of thermal expansion, and whose features can be formed with close tolerances in a low cost, reliable manner. Materials with similar coefficients of thermal expansion are used in order to maintain alignment during unexpected heating and cooling. Furthermore, a method is described that substantially eliminates the need for adhesives to bond laser components to a platform. The resultant laser can be very robust, stable, and can provide reliable operation over extended time periods.

The foregoing, together with other features and advantages of this invention, will become more apparent when referring to the following specification, claims and the accompanying drawings.

BRIEF DESCRIPTION OF THE DRAWINGS

For a more complete understanding of this invention, reference is now made to the following detailed description of the embodiments as illustrated in the accompanying drawing, wherein.

DETAILED DESCRIPTION OF THE EMBODIMENTS

Specific embodiments of the invention are described below with reference to the Figures, in which like numbers represent the same or similar elements.

An assembly process and platform including a silicon optical bench or base is described. The elements of a laser such as a DPSSL are mounted on the silicon base to form a laser assembly . The process can provide a low cost, reliable method for manufacturing a laser with a silicon base. Generally, the silicon base is precisely formed as a monolithic structure with features that define the position of the optical components of the laser assembly. As a result, the manufacturing process is simplified and only a small amount of hand adjustment is required during assembly.

Use of silicon for the base can be advantageous because it is readily available, it has good thermal conductivity and it has a low coefficient of thermal expansion. Single-crystal silicon is particularly useful, although polycrystalline silicon could be used for some applications as could other materials with similar characteristics. Use of a single monolithic silicon base for all of the laser components that require alignment has a number of advantages. One advantage is that all the laser components can be easily situated within close tolerances, which is very useful for the final alignment. Another advantage of using a single base is that a single TE cooler can be used, which simplifies design and reduces cost.

Figure 1:
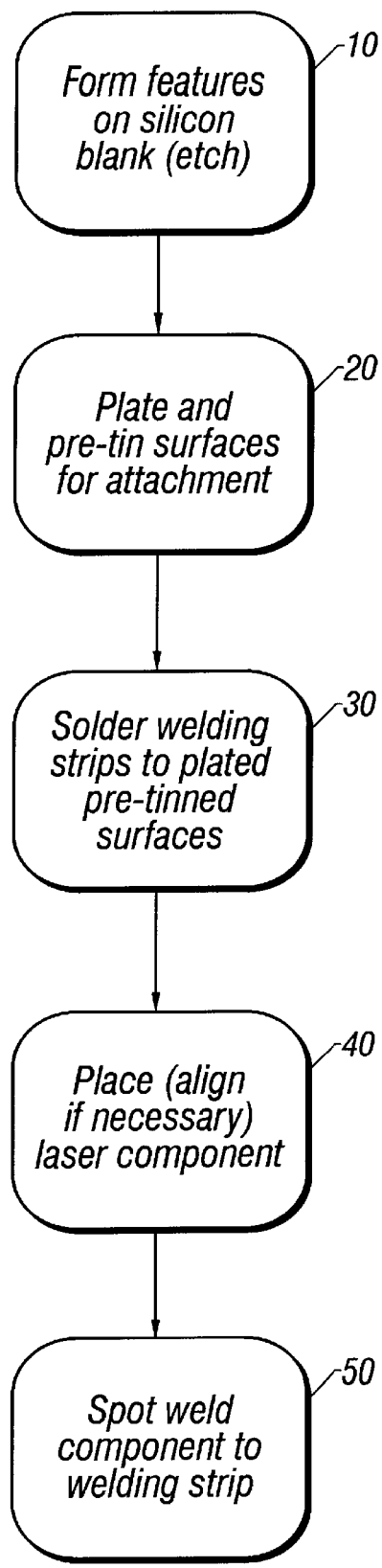
FIG. 1 is a flow chart illustrating a process for manufacturing lasers using a silicon base.

Reference is first made to FIG. 1, which is a flow chart that generally illustrates the process for making a laser assembly. The first step 10 of the process is providing a silicon blank and forming the desired features thereon. The silicon blank can be a monolithic piece. Generally, one surface of the silicon blank can be taken as the reference plane, and the other surfaces are formed parallel or perpendicular to the reference plane within predetermined tolerances. The well-defined crystal axes of single-crystal silicon permit etching as a means for forming very precise features that can be used to simplify alignment of the laser elements during subsequent assembly Etching techniques, such as chemical etching, are well known in the semiconductor industry and provide a very precise and reproducible method of forming the desired features on the silicon base. Etching techniques provide a way to produce large quantities of precise, uniformly formed silicon bases at low cost. Alternatively, the silicon base can be precision machined using diamond turning techniques to form the desired features within the required tolerances.

At step 20, one or more of the silicon surfaces on which attachment of the laser elements is to occur arc first plated with a suitable material such as nickel followed by gold ("nickel-gold"). The plated surfaces are then pre-tinned at the locations on the silicon where soldering is desired.

Next, at step 30, welding strips are soldered to the plated, pre-tinned surfaces of the silicon platform at predetermined locations, using any suitable solder such as, for example, Sn/Pb/Cd solder having ratios of 51.2/30.6/18.2, which has a melting point of about 145° C. The welding strips may be precisely positioned in order to define the position of the optical component that will be connected to it. The welding strips may comprise a material such as kovar that is suitable for soldering to a plated and pretinned silicon surface. Kovar has a small coefficient of thermal expansion (about $5 \times 10^{-6}$ m/° C.) which is close to that of silicon (about $4.6 \times 10^{-6}$ m/° C.). Also, kovar has good thermal conductivity (about 14.2 W/m/° C.). Once soldered to the silicon platform, the welding strips provide a suitable surface for welding components thereto. Additionally, kovar has good absorption characteristics at a wavelength of 1.06 microns, which is the typical wavelength of commercially available Nd:YAG welding lasers making it well suited for laser spot welding. For example, about 7.0 Joules is needed to spot weld a lap joint of 0.3 mm kovar, and about 4.0 Joules is needed for a filet joint. Furthermore, kovar is relatively easy to machine, when compared with invar. However, other materials may be used as the welding strips.

Next, at step 40, a laser component is placed in its exact desired position. The placement of the component may require alignment. The component may be held in position with, for example, a C-clamp. At step 50, after the component is properly positioned, it is spot-welded to the welding strip using a bracket or other suitable connecting device. Spot-welding is performed using a laser with an appropriate wavelength, power, and beam size, so that the component and welding strip are connected. The clamp is then removed. The positioning and welding steps are repeated for each of the laser components. Advantageously, such a welding technique provides a quick and permanent connection. Laser welding is a useful manufacturing technique for all parts that require alignment.

Sometimes it may be preferable to connect components directly to the unplated silicon. For example, a thermistor may be used for monitoring the temperature of the silicon base and therefore it may be desired to connect the thermistor directly to the silicon If components are to be attached directly to the silicon, a one-part thermal epoxy, such as is available from Epoxy Technology of Billerica, Mass., can be used. Such an epoxy will not outgas until 300° C. and $10^{-7}$ torr; however, such a thermal epoxy requires heating to high levels (e.g. 85° C. for twelve hours), and therefore a soldering process may be preferred. Additionally, Aluminum nitride can be soldered directly to silicon that has been plated and pre-tinned.

In some embodiments, a conventional thermoelectric ("TE") cooler is utilized to control the temperature of the laser assembly to cool the silicon base and maintain it at a constant temperature. The TE cooler may be attached to the base before or after the laser components are mounted.

Figure 2:
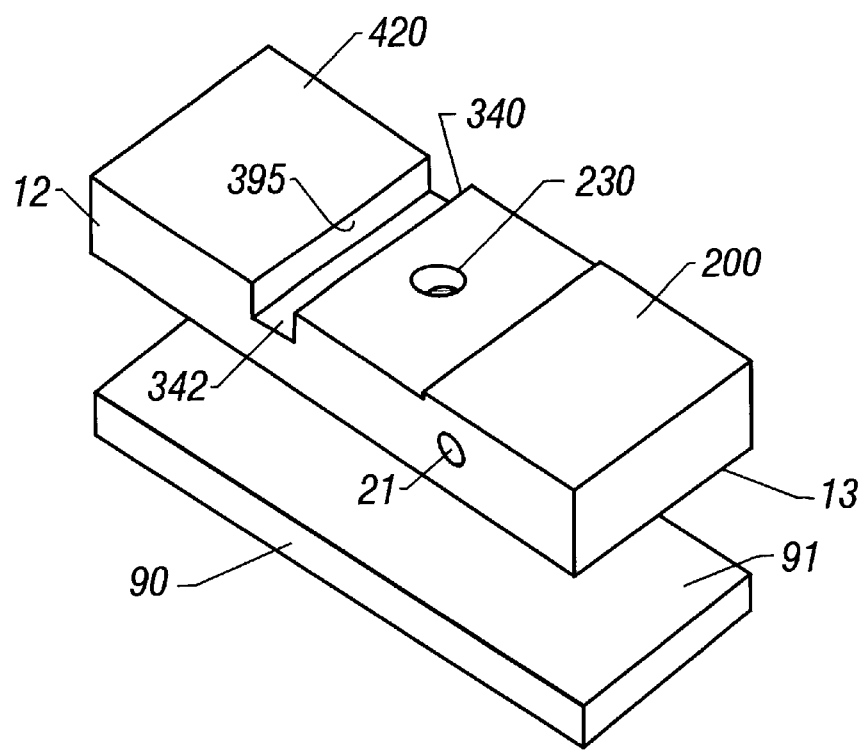
FIG. 2 is top perspective view of a base.
Figure 3:
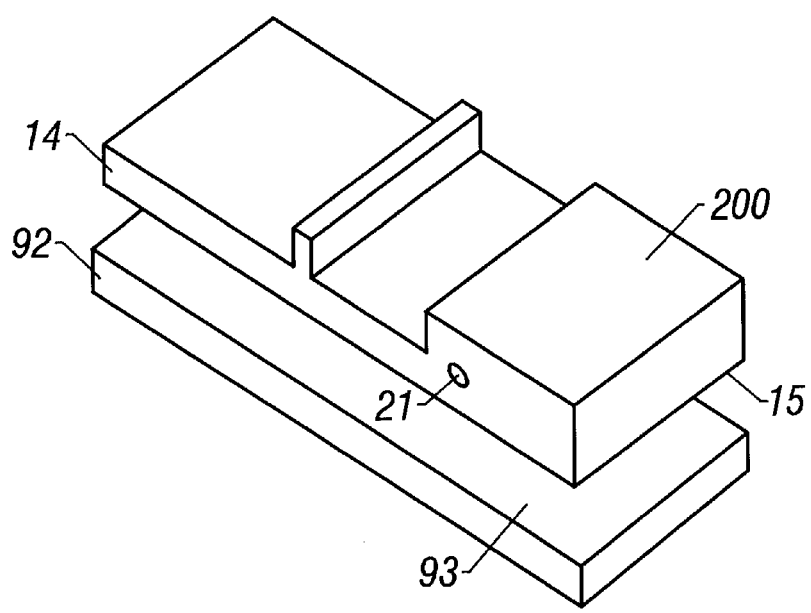
FIG. 3 is top perspective view of a base.

Referring now to FIG. 2, there is shown a first base 12 and a thermoelectric cooler 90 connected on its underside. Referring also to FIG. 3, there is shown a second silicon base 14 connected on its underside to another thermoelectric cooler 92. In such embodiments, the "cool" side 91, 93 of the thermoelectric cooler 90, 92 is attached to the underside 13, 15 of the silicon base 12, 14, which has been plated and pre-tinned, by for example soldering using a 52/48 In/Sn solder which has a melting point of about 117° C. The opposite "hot" side of the TE cooler 90, 92 may be connected onto a suitable frame (not shown) by any suitable means such as soldering. The frame acts as a heat sink for the TE cooler, and also can provide support for electrical connections to and from the laser components.

Figure 4:
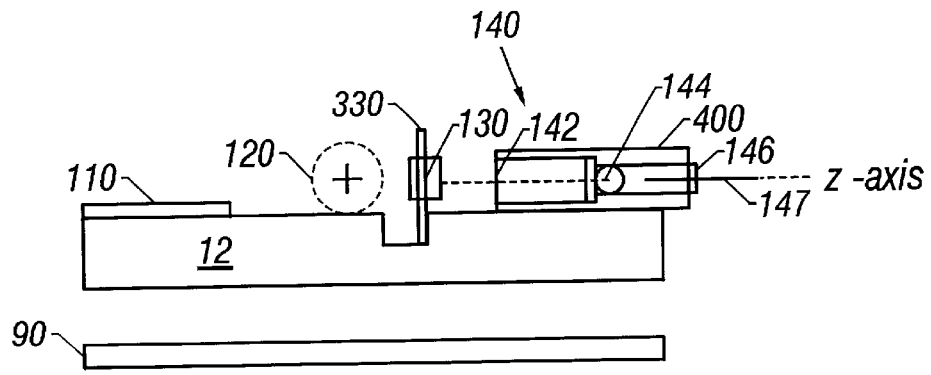
FIG. 4 is an exploded view of a laser assembly.
Figure 5:
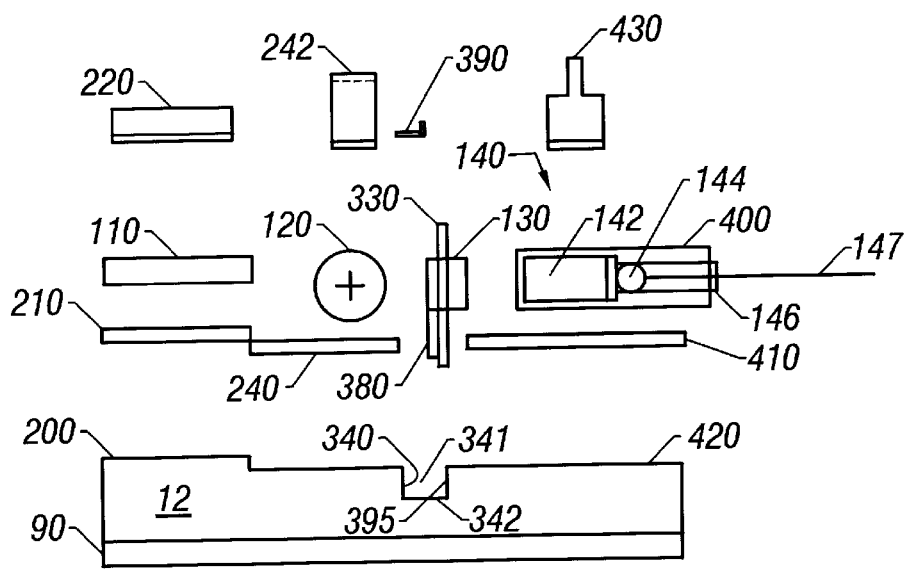
FIG. 5 is a side view of a laser assembly.
Figure 6:
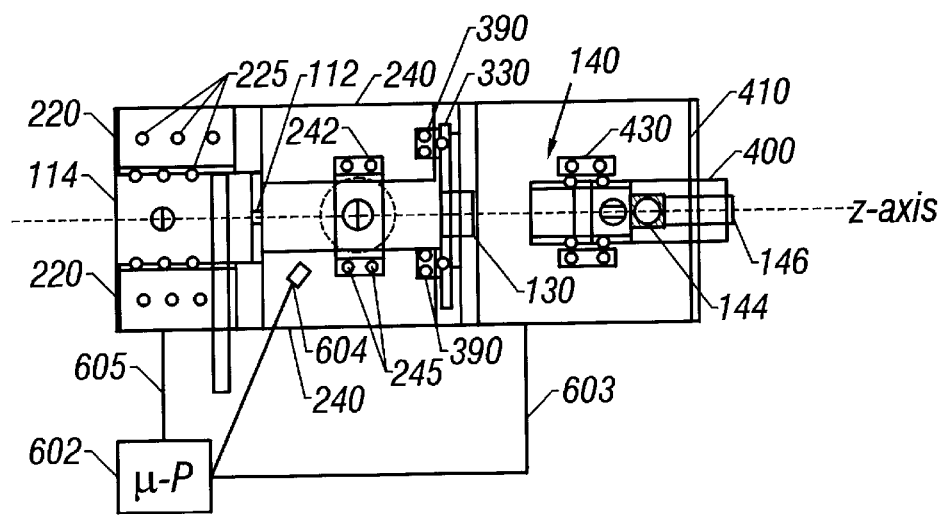
FIG. 6 is a plan view of a laser assembly.

Referring now to FIGS. 4, 5, and 6, a more detailed description of the laser assemblies and their manufacture will be provided. FIGS. 4, 5, and 6 are a side view an exploded side view and a top view, respectively, of an embodiment of a laser assembly including a silicon base.

The laser elements (for example a DPSSL) include a laser diode assembly 110, a coupling lens 120, a solid state laser unit 130, and a laser output assembly 140, all of which are mounted on the silicon base 12. Other optical components, such as an optical modulator (not shown) may also be mounted on the base 12. The solid state laser unit may include a gain medium and other optical or electro-optical components attached thereto. A laser cavity may be defined within the solid state laser unit 130 by opposing reflective sides of the solid state material within the unit and the other optical components attached thereto. The laser output assembly 140 may include an optical isolator 142, a fiber coupling lens 144, a fiber-ferrule 146, and an optical fiber 147.

In one example of a DPSSL, the solid state laser unit 130 is aligned to within ten microns, the coupling lens 120 is aligned to within 100 microns along the z-axis and to within 10 microns along the x- and y-axes. The laser output assembly 140 is aligned to within 100 microns along the z-axis, and to within 5 microns along the x- and y-axes. The x-y-z axes are defined by the laser beam; the z-axis is aligned with the center of the laser beam, and the x and y axes are perpendicular to the z-axis.

The laser diode assembly 110 is mounted on the silicon base on a platform 200 provided on the base 12 in a position to emit optical radiation toward the next optical element. As illustrated in FIG. 6, a laser diode chip 112 is part of the assembly 110 in which the small laser diode chip 112 is mounted onto to a much larger metal block 114 which may be formed of copper. Any suitable laser diode can by utilized as long as it provides the desired output characteristics such as wavelength and power. In one embodiment, a conventional broad area laser diode for optical pumping at an appropriate wavelength is used, for example at 980 nm or 809 nm. Alternatively, a laser diode bar or an array of laser diodes may be used in place of a broad area laser diode.

To affix the laser diode assembly 110 in position, a pair of welding bars 210 are soldered in predetermined positions to the plated, pre-tinned diode platform 200 of the base 12 in order to provide a means for attaching the laser diode assembly Tile laser diode assembly 110 is then situated between the two welding bars 210 and thereby, the two welding bars 210 aid in initially positioning the laser diode assembly at a predetermined position. In order to more effectively conduct heat from the laser diode into the base 12, a suitable foil such as an indium foil (not shown) can be placed between the laser diode assembly 110 and the base 12.

Because the placement and facet orientation of the laser diode chip 112 within commercially available laser diode assemblies are not held to tolerances which may be required for the DPSSL, an alignment step may be utilized. Accordingly, the laser diode assembly 110 can be aligned by any appropriate technique. For example, alignment can be accomplished using a HeNe laser with any suitable reference points on the laser diode 112 and base 12.

Once the laser diode 112 is properly aligned, a suitable device such as a C-clamp is used to hold the laser diode assembly 110 in position for welding to the welding bars 210. To couple the laser diode assembly 110 to the welding bars 210, a pair of L-shaped brackets 220 are positioned so that one side of the "L" contacts the welding bar and the other side contacts the laser diode assembly. The L-shaped brackets 220 are first spot-welded to the laser diode assembly 110 using a laser welding process in which a high energy beam of laser radiation is directed at the spot to be welded, and then similarly spot-welded to the welding bars. The welding spots are indicated by dark spots 225 in FIG. 6. Several welding spots may be used to affix the brackets 220 to the welding bars 210 and the laser diode assembly 110. In one embodiment the L-shaped brackets 220 are formed of kovar, a material that easily welds to the kovar welding bars.

Alternatively, the laser diode chip 112 can be mounted directly on the diode platform 200 of the base 12. The laser diode chip 112 can be aligned reliably and quickly with precision-formed features on the silicon. Particularly, silicon etching techniques are used to provide precisely positioned marks and/or ridges on the diode platform 200, and the laser diode chip is aligned reliably and quickly by utilizing the appropriate marks and/or ridges. In such an embodiment, the time-consuming HeNe laser alignment step can be omitted. After proper positioning of the laser diode chip, which may comprise silicon, it is soldered directly to the silicon base. Such an embodiment can provide reduced assembly time, lower material cost by eliminating the metal block, provide greater reliability and improve yield.

Conventional focusing optics such as a ball lens 120 may be used to focus optical radiation from the laser diode 112 into a predetermined focal point within the gain medium of the solid state laser unit 130, thereby providing high intensity optical radiation to pump the gain medium. Alternatively, other types of known focusing optics can by used or the coupling lens may be omitted. For example the laser diode may be situated sufficiently close to the solid state laser unit 130 to directly pump the gain medium without the need to focus the pump radiation, a configuration commonly termed "butt-coupled".

A lens receptacle 230 (FIG. 2) may be formed in the base 12 to hold the lens in its proper position and alignment to receive pump radiation from the laser diode. For a ball lens, the lens receptacle 230 (FIG. 2) can be in the form of a hole machined or etched into the silicon base at a predetermined location with a predetermined shape to provide a suitable lens receptacle. The hole could comprise any shape, for example circular, triangular or square. In one embodiment, kovar welding strips 240 are soldered to the plated, pre-tinned silicon base on either side of the lens receptacle 230 as shown in FIG. 6. The welding strips have sufficient length to provide welding surfaces on either side of the ball lens 120. The ball lens is then situated in the lens receptacle 230, which aligns the lens in the desired position. A U-shaped kovar bracket 242 having two legs is then placed over the ball lens. The U-shaped bracket 242 is configured to securely hold the ball lens 120 therein. Each leg of the U-shaped bracket is spot-welded, for example at spot welds 245 with a high power laser beam, to permanently hold the ball lens in position.

Figure 7:
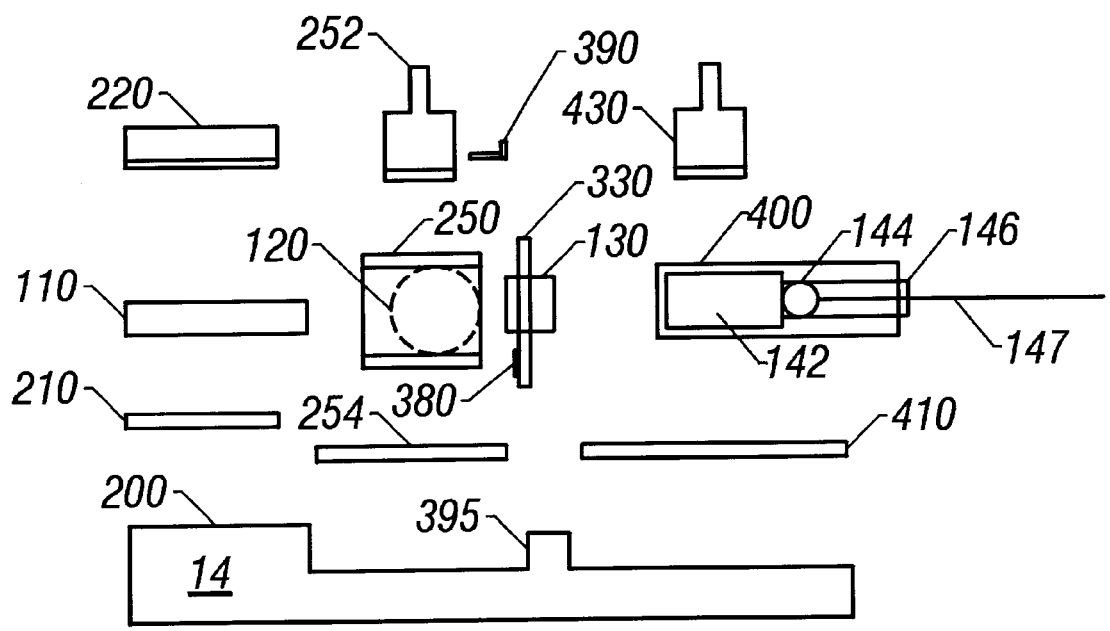
FIG. 7 is an exploded view of an alternative embodiment of a laser assembly.
Figure 8:
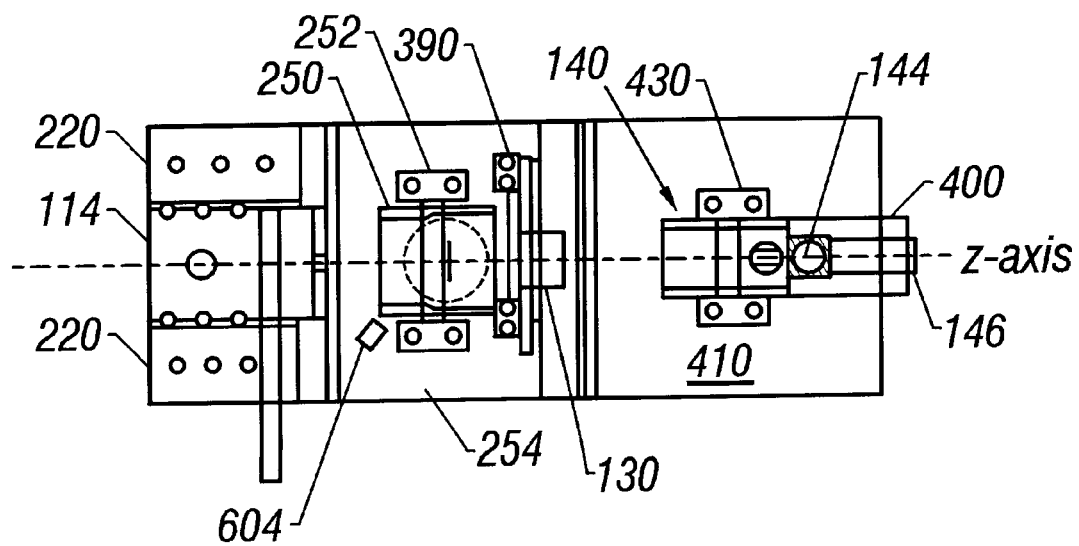
FIG. 8 is an plan view of an alternative embodiment of a laser assembly.

Turning briefly to FIGS. 7 and 8, an alternative arrangement of the coupling lens 120 will be described. In the assembly depicted in FIGS. 7 and 8 the coupling lens, such as a ball lens, is situated in a lens holder 250. The lens holder 250 may be a metal cylinder. The lens holder 250 containing the coupling lens 120 is placed on the silicon base in a predetermined location, and may be aligned using a HeNe alignment beam using any useful reference point. Alternatively, silicon etching techniques are used to provide precisely positioned marks and/or ridges on silicon base to that the lens holder can be aligned reliably and quickly by utilizing the appropriate marks and/or ridges. A U-shaped clip 252, which may be formed of kovar, includes two legs that straddle the lens holder 250. A single welding pad 254 that may also be formed of kovar, is connected to the silicon base, and the two legs of the U-shaped clip 252 are spot welded to the kovar welding pad.

Figure 9:
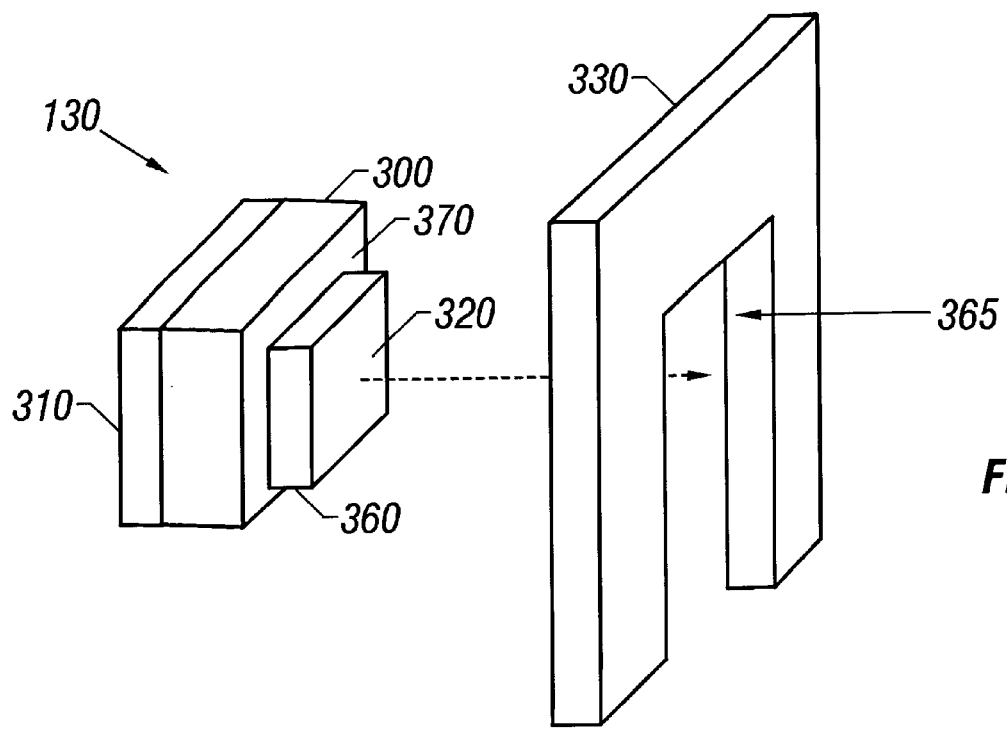
FIG. 9 is a perspective view of a laser unit.
Figure 10:
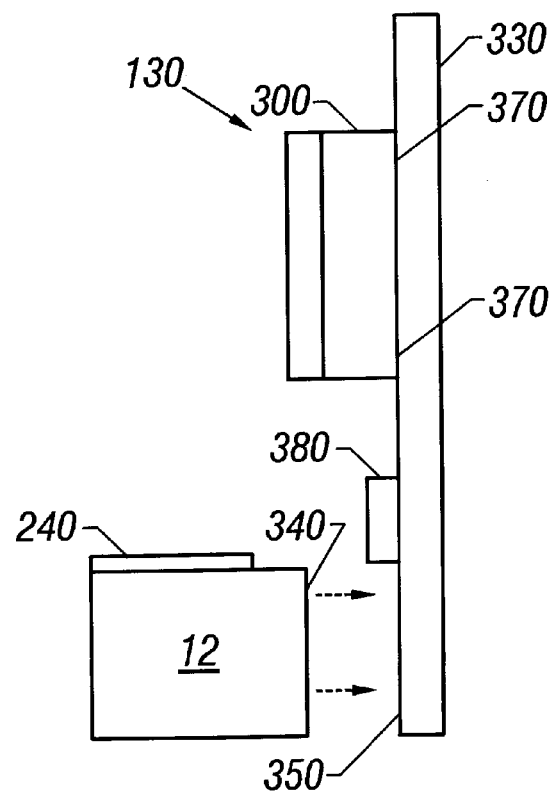
FIG. 10 is detail side view showing assembly of laser unit to a base.

Referring now to FIGS. 9 and 10 in conjunction with FIGS. 4, 5, and 6, a further description of the laser unit 130 and its assembly will be provided. The laser unit 130, can be any suitable laser unit, with an appropriate gain medium 300. The laser unit may include a solid state gain medium bonded to a nonlinear crystal (not shown) for frequency doubling by, for example, optical contact. Alternatively, the laser unit may include a solid state gain medium bonded to a polarizer, and an intracavity electro-optic unit. However, the solid state laser unit may include only a solid state gain medium. Other embodiments may include one or more optical elements affixed to the solid state gain medium, such as a polarizer, a heat spreader, and/or an intracavity electro-optic unit.

A vertical support member 330 is affixed to the laser unit 130. The vertical support member 330 is affixed to the silicon base in a position so that the laser unit is situated to be optically pumped by pump radiation from the laser diode assembly 110. A vertical face 340 (FIG. 5) is formed in the base 12 at a predetermined distance from the ball lens 120 as one side of a trench 341 which also has a bottom surface. The vertical support member has a corresponding vertical surface 350 that abuts against the vertical face 340 and may also rest on the bottom surface 342. As a result, the laser unit 130 can be positioned approximately within the proper z-plane (i.e. it is positioned properly along the lasing axis) when surface 350 abuts against face 340. Also, the abutment between the vertical face 340 and the vertical surface 350 can provide a means for conducting away heat produced within the laser unit 130. The bottom surface 342 can provide alignment in the v-axis.

A laser cavity is defined by optical coatings formed on opposing ends 310 and 320 of the laser unit 130 Such a laser cavity may define a flat-flat configuration, a curved-flat configuration, or any other suitable laser cavity configuration, as is known to those of ordinary skill in the art. Alternatively, one or more mirrors (not shown) that define ends of the laser cavity may be suitably fixed to the silicon base in predetermined positions to define an optical cavity. Such mirrors can be attached to the base 12 in a manner similar to that described above for attaching the coupling lens 120.

The vertical support member 330 is shown with a C-shape, although other appropriate shapes can be used. In the embodiment illustrated in FIGS. 9 and 10, the laser unit has a section 360 with a shape that fits within the center opening 365 of the support member 330. Adjoining the shaped section 360, the surface 370 of the gain medium 300 directly contacts the vertical support member and thus provides a thermal path from the gain medium 300 to the support member 330. The laser unit may be soldered to the support member by, for example a gold solder. Alternatively any suitable method, such as thermal epoxy, may be used.

The support member 330 may be connected to the base 12 in such a way as to provide a path for heat flow from the support member 330 to the base 12. In one embodiment flat faces of the support member are set into thermal contact with an opposing vertical flat face of the silicon base. Thermal conductivity may be enhanced by use of indium foil or thermal epoxy between the vertical surface 350 of the support member and the vertical face 340 in the silicon base.

To affix the support member 330 to the base 12, a welding strip 380 may be soldered to the support member 330 proximate to the vertical surface 350. The welding strip 240 that is used to connect the coupling lens may be extended far enough to be used as the attachment point to the silicon base. A pair of L-shaped brackets 390 (FIGS. 5 and 6) are then used to permanently affix the support member 330 in place by spot-welding welding the brackets to the welding strips 380 on the support member and the adjacent welding strips 240 using a suitable welding technique. Before welding, the laser unit 130 may be aligned to the proper x-y coordinates by any suitable method such as using a HeNe laser. In FIGS. 5 and 6, the support member 330 is shown connected to the vertical surface nearest the ball lens. Alternatively, as depicted In FIG. 4, the support member 330) can be connected to an opposite vertical surface 395 (i.e. the vertical surface closest to the output assembly).

In some circumstances, it is desirable to electrically isolate the laser unit 130 from the conductive silicon base 12 while still providing a path for heat to flow from the solid state laser unit to the base 12. In one such embodiment an aluminum nitride ("AlN") support member may be used to hold and position the laser unit onto the silicon base. AlN can be spot-welded to kovar using a high power laser as follows. The AlN support element is metallized in predetermined locations to provide soldering pads, such as to solder kovar brackets, which can be laser welded to the corresponding kovar welding strips on the base. Also, in an embodiment in which a modulator element is included, the AlN can be used to provide an electrode to deliver the required drive voltage/current to the modulator element of the laser unit with the necessary bandwidth.

AlN has a coefficient of thermal expansion very close to that of silicon, and has high thermal conductivity (170 W/m/° C.) and a low thermal expansion coefficient (4.6× $10^{-6}$ m/° C.). However, other materials can be used. It is advantageous if the material is thermally conductive and has a thermal expansion coefficient approximately equal to the thermal expansion coefficient of silicon.

Referring again to FIGS. 4, 5, and 6, a further description of the laser unit laser output assembly 140 and its assembly will be provided. The laser output assembly 140 can be any configuration that provides a suitable laser output. Generally, beam shaping components can be utilized to provide a desired laser output. In the embodiments depicted in FIGS. 4, 5, and 6, the laser output assembly includes an optical isolator 142, a fiber coupling lens 144, a fiber-ferrule 146, and an optical fiber 147, all situated in a cylindrical metal housing 400 to provide a fiber optic coupler assembly. The optical isolator 142 receives and isolates the laser output. The fiber coupling lens 144 focuses the isolated output into the optical fiber 147.

The housing 400 can be machined from stainless steel with appropriate shape to accommodate the optical isolator 142, the coupling lens 144 and the fiber-ferrule 146.

The coupling lens 144 can be mounted onto a machined kovar ring assembly (not shown) using a one-part thermal epoxy such as one available from Epoxy Technology of Billerica, Mass. As discussed above, such an epoxy will not outgas until about 300° C. and $10^{-7}$ torr. The coupling lens 144 and kovar ring assembly are then inserted into the housing 400 The optical isolator 142 is placed in the housing resting firmly against the coupling lens assembly. The optical isolator 142 is laser welded into the wall of the housing 400, which also secures the coupling lens assembly. The fiber-ferrule 146 is then inserted into the housing.

To connect the laser output assembly, a kovar welding pad 410 is soldered to an output pad 420 formed on the silicon base. The laser output assembly 140 is then placed in its preliminary position and aligned using the laser output from the solid state laser unit 130, which ensures maximum fiber output and polarization extinction ratio. When the laser output assembly 140 is aligned, a U-shaped kovar bracket 430 is put in position over the laser output assembly 140 and the bracket is spot-welded to the kovar welding pad 410 previously soldered onto the silicon platform.

We have found that a single base 12 can still allow for thermal differences (e.g., optimal results at different temperatures) between the laser diode assembly 110 and the laser unit 130 by proper selection of the temperature of the base 12 (base temperature) and bias current applied to the laser diode. Because the heat generated in the laser diode is a function of the bias current that drives it, its temperature is approximately a function of the bias current and the temperature of the silicon base 12. The temperature of the laser assembly is approximately a function of the pump power received from the laser diode and the temperature of the silicon base 12. Thus, the pump power and the base temperature can be considered as the two variables in two simultaneous equations that determine the temperatures of the laser diode and the laser element. The thermal resistance between the laser diode assembly 110, the laser assembly 130 and the base 12 can be considered to be approximately constant. Therefore, by monitoring the output of the laser assembly while varying the base temperature and the pump power, the base temperature and the pump power for optimizing the desired laser output of the laser assembly can be determined. Then, the optimized laser output can be maintained by using feedback and control techniques for the temperature of the silicon base and the optical pump power.

For example, the base temperature can be maintained and controlled by controlling the single TE cooler 90 by any suitable means. In order to monitor the temperature of the silicon base, a temperature sensor such as a thermistor may be mounted in a hole 21 in the silicon base 12 (see FIG. 2) and its output provided by a connection 603 to a controller 602, such as a microprocessor, (FIG. 6) which controls the TE cooler 90 by a connection 605. The controller can thereby monitor and control the temperature of the base 12. To monitor the optical pump power, a photodetector 604 (FIG. 6) may be situated on the base 12 to detect a portion of the optical pump radiation such as that back scattered from the coupling lens 120. The output from the photodetector can be provided to the controller 602. The controller 602 can control the bias current of the laser diode based upon the output from the photodetector 604 to insure that the desired optical pump power is supplied.

Though the invention has been described above with reference to specific embodiments, it will be understood that various omissions, substitutions and changes in the form and details of the devices and methods described above may be made by those skilled in the art without departing from the spirit and scope of the invention. For example, one or more additional components such as a light modulator and/or a polarizer can be situated on the optical base. Various suitable materials and methods can be utilized to hold the laser components to the base, including various adhesives and mechanical fasteners.

Therefore, this invention is to be limited only by the following claims when viewed in conjunction with the above specification and accompanying drawings.

What is claimed is:

1. A laser assembly comprising:
   a platform including a silicon base;
   a plurality of laser elements attached to said silicon base including a laser diode and a solid state laser unit that comprises a gain medium arranged to be optically pumped by said laser diode;
   a cooling unit coupled to said base; and
   means for maintaining an approximately constant first temperature in said gain medium and an approximately constant second, different temperature in said laser diode.

2. The laser assembly of claim 1 wherein said silicon base comprises monolithic single-crystal silicon that includes features etched in said single-crystal silicon.

3. The laser assembly of claim 2 wherein said etched features include means for aligning said laser elements.

4. The laser of claim 1 and further comprising a photodetector for sensing the optical pump radiation and a circuit responsive thereto for controlling the source of optical pump radiation to maintain an approximately constant optical pump power.

5. The laser of claim 4 wherein said cooling unit comprises means for maintaining a predetermined temperature in said silicon base.

6. The laser assembly of claim 5 wherein said cooling unit comprises a thermoelectric cooler coupled to said silicon base.

7. The laser assembly of claim 1 wherein said plurality of laser elements further comprises a laser output assembly attached to the silicon base, said laser output assembly arranged to receive the output of said solid state laser unit.

8. The laser assembly of claim 7 wherein said laser output assembly comprises an optical isolator arranged to receive the laser output of said solid state laser unit, a fiber coupling lens arranged to receive the isolated laser output, and an optical fiber situated to receive the focused laser output.

9. The laser assembly of claim 1 wherein said solid state laser unit comprises a monolithic structure including a laser cavity and a solid state gain material situated therein.

10. The laser assembly of claim 1 wherein said plurality of laser elements further comprises a coupling lens attached to said silicon base, said coupling lens arranged to couple optical pump radiation from said laser diode into said solid state laser unit.

11. A laser assembly comprising a silicon base;

a plurality of laser components coupled to said silicon base, including a laser diode and a solid state laser unit that together comprise a diode-pumped solid state laser (DPSSL); and means for connecting said laser components to said silicon base, including at least one welding strip interposed between said silicon base and one of said laser components.

12. The laser assembly of claim 11, further comprising means for cooling said silicon base.

13. The laser assembly of claim 11 wherein said means for connecting said laser components to said silicon base includes a plurality of welding strips for coupling said silicon base and said laser component.

14. The laser assembly of claim 13 and further comprising:

a support member for coupling said welding strip to said laser element.

15. The laser assembly of claim 14 wherein said support member comprises aluminum nitride.

16. The laser assembly of claim 13 wherein said silicon base is plated and pretinned for coupling with said welding strip.

17. The laser assembly of claim 11 wherein said silicon base comprises monolithic single-crystal silicon that includes features etched in said single-crystal silicon.

18. The laser assembly of claim 17 wherein said etched features include a vertical face for aligning at least one of said laser components attached to said silicon base.

19. The laser assembly of claim 11, further comprising:

a coupling lens; and means for connecting said coupling lens to said silicon base in a predetermined position with respect to the laser diode so that the coupling lens focuses pump radiation from the laser diode into the solid state laser unit.

20. The laser assembly of claim 11 and further comprising:

a laser output assembly; and means for connecting said laser output assembly to said silicon base in a predetermined position to receive the laser output from the solid state laser unit.

21. The laser assembly of claim 20 wherein said laser output assembly comprises an optical isolator arranged to receive the laser output of said solid state laser unit, a fiber coupling lens arranged to receive the isolated laser output, and an optical fiber situated to receive the focused laser output.

22. The laser assembly of claim 11 wherein said solid state laser unit comprises a monolithic structure including a laser cavity and a solid state gain material situated therein.

* * * * *